Figure 1:
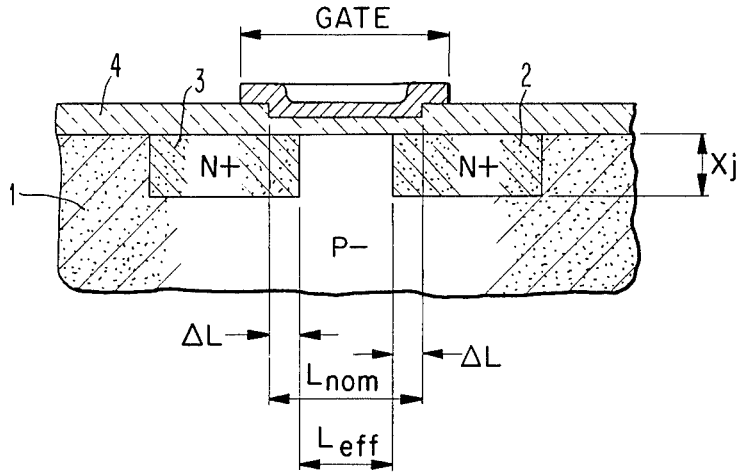
Figure 2:
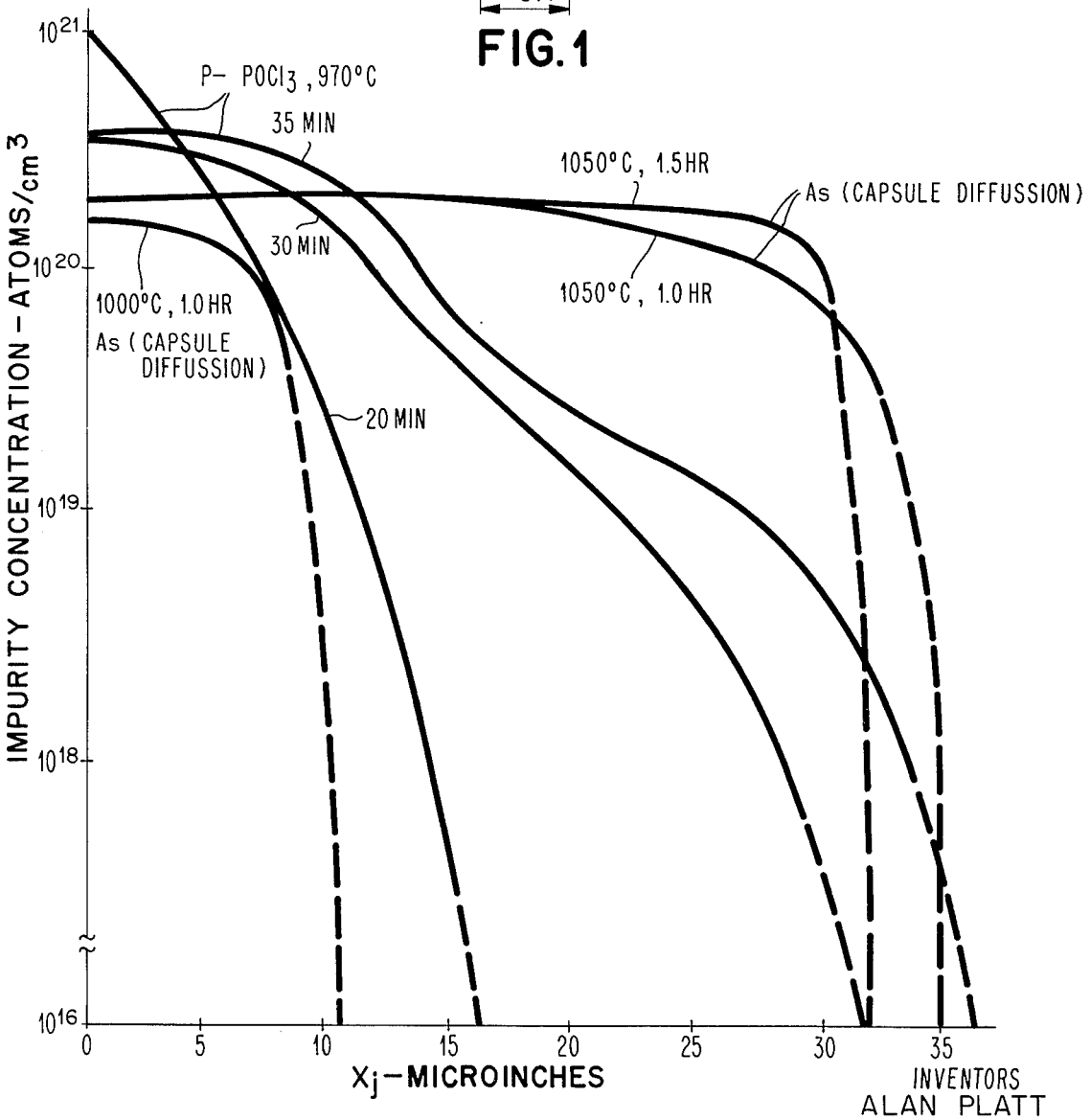

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED JANUARY 6, 1976

942 O.G. 190

T942,005

INSULATED GATE FIELD EFFECT TRANSISTOR

Alan Platt, Lagrangeville, N.Y., and Edward Terner, Shelburne, Vt., assignors to International Business Machines Corporation, Armonk, N.Y.

Continuation of abandoned application Ser. No. 124,888, Mar. 16, 1971. This application Aug. 19, 1974, Ser. No. 498,490

Int. Cl. H01l *29/78, 29/167*

U.S. Cl. 357—23

1 Sheet Drawing. 12 Pages Specification

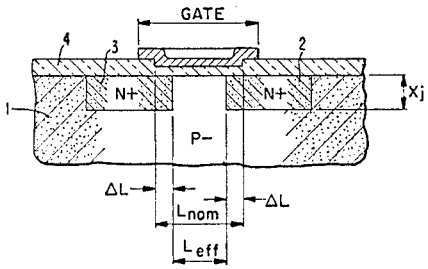

A silicon N-channel insulated gate field effect transistor having shallow arsenic-doped source and drain regions is disclosed. The arsenic dopant introduces fewer defects than phosphorus dopant, in high concentrations. Source and drain depth may be 5 to 30 microinches (0.127 to 0.762 micron), channel length may be 0.1 to 0.3 mil (2.54 to 7.62 microns). The source and drain regions may have a sheet resistivity of between 5 and 15 ohms per square.

INSULATED GATE FIELD EFFECT TRANSISTOR

Original Filed Aug. 19, 1974

INVENTORS
ALAN PLATT
EDWARD TERNER

BY

ATTORNEY